United States Patent [19]

Tsukamoto

[11] Patent Number: 5,229,167
[45] Date of Patent: Jul. 20, 1993

[54] METHOD OF FORMING A FILM PATTERN ON A SUBSTRATE

[75] Inventor: Masahide Tsukamoto, Nara, Japan

[73] Assignee: Matsushita Electric Industrial Co., Ltd., Osaka, Japan

[21] Appl. No.: 500,246

[22] Filed: Mar. 27, 1990

[30] Foreign Application Priority Data

Mar. 27, 1989 [JP] Japan ................. 1-75347

[51] Int. Cl.⁵ .............................. B05D 1/32
[52] U.S. Cl. ......................... 427/259; 427/108; 427/109; 427/110; 427/126.2; 427/126.3; 427/264
[58] Field of Search ............. 427/259, 264, 108, 109, 427/110, 122–124, 126.2, 126.3, 162, 270

[56] References Cited

U.S. PATENT DOCUMENTS

| | | |
|---|---|---|
| 3,056,696 | 10/1962 | Browne .................. 427/110 |
| 3,632,339 | 1/1972 | Khan . |
| 3,978,249 | 8/1976 | Cooke ................. 427/259 X |
| 3,991,227 | 11/1976 | Carlson et al. ............ 427/109 X |
| 4,424,271 | 1/1984 | Keel et al. . |
| 4,477,486 | 10/1984 | Boaz ................. 427/264 X |
| 4,572,880 | 2/1986 | Miura . |

Primary Examiner—Terry J. Owens
Attorney, Agent, or Firm—Wenderoth, Lind & Ponack

[57] ABSTRACT

A film pattern of a desired material is formed on a substrate by forming a pattern of powder of inorganic material on the substrate, forming at least a single layer of film of desired material on the substrate on which the pattern of the powder of inorganic material is formed so that a part of the film of the desired material is formed on at least a part of the pattern of the powder of inorganic material, and mechanically removing the pattern film of the powder of inorganic material together with a part of the film of the desired material formed thereon.

5 Claims, 2 Drawing Sheets

METHOD OF FORMING A FILM PATTERN ON A SUBSTRATE

BACKGROUND OF THE INVENTION

1. Field of the Invention

The present invention relates to a method of forming a film pattern on a substrate, and a panel substrate used in display panel such as liquid crystal.

2. Description of the Prior Art

In panel substrates or the like having light-transparent electrodes to be used in printed circuit board, integrated circuit, liquid crystal display panel or the like, many methods are known and practically used for forming a conductive film in a desired pattern. The most widely known method is the process by photolithograph technology and chemical etching. According to this method, a conductive film is formed on a substrate on which a pattern is to be formed, and a photosensitive resin (photoresist) film is formed on this conductive film. This photoresist film is disposed with light through a photomask in a predetermined pattern. The photoresist in the disposed area is made insoluble in solvent, and the soluble part is removed by solvent. Afterwards, the film is etched by chemicals to obtain the predetermined pattern. This method is high in precision, and is capable of forming a pattern in a considerably large film thickness.

One of the other methods is the lift-off method by using a photoresist. In this method, same as in the foregoing method, the photoresist film is formed in a pattern, but what is different is that the photoresist film is formed in a predetermined pattern on the substrate in the first place. Later, a film of a desired material is disposed, and the insoluble photoresist pattern is dissolved and removed together with the film of desired material thereon by using other chemicals. To make lift-off easy, ultrasonic energy or other mechanical force may be used sometimes auxiliarily. This method is also employed widely.

In the method of forming a resist film pattern, the process of making use of printing is also known in the fabrication of printed circuit board. A method of directly cutting off the film on the substrate mechanically is also known. Or a method of destroying the film by laser and forming a pattern is known, too.

In such pattern forming methods, there are specific demerits. In the method using photoresist, the photoresist pattern forming step is complicated and troublesome. The step is very long including application of uniform photoresist film, prebaking, exposure, development, postbaking and others, the setting of conditions is difficult and unstable, and many expensive chemicals are needed. Besides, huge equipment and an enormous cost are required for treatment of the spent chemicals. In addition, many expensive facilities are used in each step. Moreover, in the etching step using chemicals, there are many problems in the control of process conditions, waste liquid treatment, facility cost and others. In the lift-off method, although the etching step is not needed, a heat treatment for enhancing the adhesion strength of the film to the substrate after forming the film cannot be sufficiently performed because of the heat resistance of the resin and fixing. The method of cutting off the film mechanically is handy, but the substrate itself will be injured, and the precision is poor, and it may be applied only in a limited range of products. The laser method has its own problems in low machining speed and poor linearity of the cut section.

SUMMARY OF THE INVENTION

It is hence a primary object of the present invention to present a method of forming a panel substrate having various film patterns to be easily used in liquid crystal display device or the like and a panel substrate by solving the above-discussed problems.

In one method of the present invention, a pattern film containing powder of inorganic material is formed on the substrate, and a film of a desired material is formed in one layer or multiple layers on the entire surface of the pattern film, or in a part by masking, and the film of the desired material is removed together with the pattern film containing the powder of inorganic material mechanically, thereby forming a predetermined pattern.

In another method of the present invention, a pattern containing powder of inorganic material and binder is formed on the substrate, and a film of a desired material is formed on the entire surface, and then it is heated to burn out and eliminate the binder to make it mechanically weak, thereby making it easier to remove mechanically in the subsequent process.

In still another method of the present invention, a pattern containing powder of inorganic material is formed by mechanically drawing or scratching. Accordingly, the precision of the pattern is improved from that of printing.

In yet another method of the invention, after forming a pattern film containing powder of inorganic material by printing or other method, it is baked to burn and eliminate the binder and other undesired material to leave the pattern almost made of powder of inorganic material alone, and then a film of a desired material is formed thereon. Accordingly, in a subsequent mechanical removing process, only by lightly wiping the substrate surface, the film of desired material may be formed in a desired pattern.

- According to the present invention, thus, since the pattern containing powder of inorganic material is formed on the substrate, there is no limitation to the temperature and atmosphere for forming the film of desired material thereon subsequently, and moreover the pattern of the powder of inorganic material itself is mechanically weaker than the strength of the film of the desired material to be formed later, so that the film of the desired material may be finished in a desired pattern by a simple step of wiping off lightly and brushing.

Therefore, the yield is higher than in the conventional photolithographic process. The process is much shorter than the conventional pattern forming method, and expensive chemicals and facilities are not needed. Pollutant waste liquids are not discharged, and the treating equipment is not necessary. Therefore, the manufacturing cost is lowered.

DESCRIPTION OF THE PREFERRED EMBODIMENTS

Figure 1A:
FIGS. 1(a), 1(b), 1(c) and 1(d) are drawings for explaining the principle of the pattern forming method of the present invention.

Referring now to the drawings, the pattern forming method and the panel substrate fabricating method of the present invention are described in detail below.

Figure 1B:
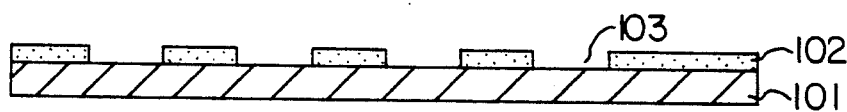
Figure 1C:
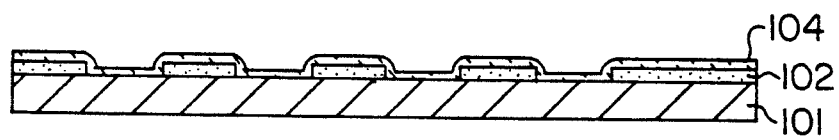
Figure 1D:
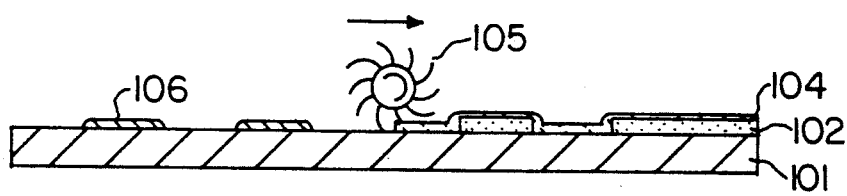

FIG. 1 shows the principle of pattern forming method of the present invention. In FIG. 1 a), numeral 101 is a substrate made of ceramic, glass, metal or the like.

Numeral 102 is a film containing powder of inorganic material. As evident from the principle of pattern forming, the inorganic material can be used in a wide selection. It may be selected so as to be suited to the subsequent film forming process (vapor deposition, CVD, sputtering deposition, etc.). For example, when exposed to high temperature during film forming process, the material must withstand such temperature. Graphite is a material suited to the pattern forming method of the invention in ever respect.

Carbon, titanium oxide, alumina, zinc oxide, zinc sulfide and almost all inorganic powder materials may be used. The content of the powder of inorganic material in the film 102 may be large to weaken the mechanical strength. But if the film 102 in too weak, the pattern in the process may be broken, and hence it may be determined in relation with the strength of the film of the desired material. The particle size of the powder is preferably smaller because it is excellent in the precision of pattern and adhesion to the substrate. When the particle size is 5 $\mu$ or less, favorable results are often obtained in respect of adhesion.

When the film containing powder of inorganic material contains an organic matter as the binder, it may be heated before fitting the film to decompose and burn out the organic matter. When forming a film in vacuum, gas may be generated from the organic matter and film of good quality may not be obtained.. In such a case, when the film is heated beforehand, an excellent film may be obtained.

Figure 2A:
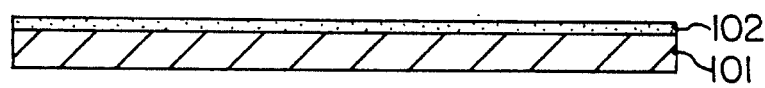
FIGS. 2(a), 2(b), 2(c) and 2(d) are explanatory drawings of an embodiment for forming a pattern film containing powder of inorganic material.
Figure 2B:
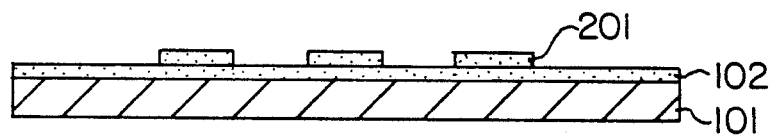
Figure 2C:
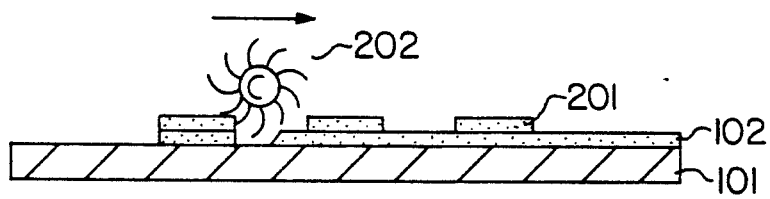
Figure 2D:
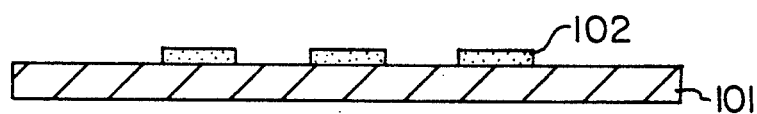

In FIG. 1 b), part of the film containing the powder of inorganic material is removed. Numeral 103 represents the removed portion, and many methods are applicable for partially removing the film 102 containing powder of inorganic material. The simplest and direct method is the mechanical chipping method. It is possible to remove by chemical etching after forming a photoresist film by photolithography or printing, or finish the film containing the powder of inorganic material to a predetermined pattern by brushing, by making use of the difference in the mechanical strength between the photoresist portion and the film containing the powder of inorganic material. Relating to this final method, an example is explained later by referring to FIG. 2. It is also possible to form pattern by directly printing an ink containing the powder of inorganic material on the substrate. In the present invention, as shown in FIG. 1 b), the pattern film containing powder of inorganic material is formed.

In FIG. 1 c), a film 104 of desired material is formed on the entire surface of the pattern film. The material of the film 104 ma be, either metal or semiconductor or insulator. The forming method may be any one of the conventional processes such as vapor deposition, plating, CVD and sputtering deposition. A chemical mist is sprayed to the substrate heated to a high temperature to induce chemical reaction on the substrate surface, and the film of desired material is formed (which is called mist spray method hereinafter). The mist spray method is widely used in forming films of tin oxide and indium oxide.

In FIG. 1 d), after forming the film of desired material, the surface is brushed with a rotary brush 105 to form a pattern of the film of desired material. The film containing the pattern of powder of inorganic material is mechanically weak, and it is removed together with the film of the desired material. Numeral 106 is a film of desired material left over in a predetermined pattern, which is strong mechanically and is not removed because there is no film containing powder of inorganic material between the film of the desired material and the substrate. In the brushing step, the means of brushing is not limited to such a brush as the rotary brush 105. What must be noted here is that the mechanical strength of the film of the desired material should be greater than the film containing the powder of inorganic material. In other words the film containing the powder of inorganic material may be made mechanically weaker. Needless to say, it is also effective to regulate the strength of mechanical removal so as not to injure the film of the desired material. For example, after forming film in FIG. 1 c), heat treatment is effected (by exposing to high temperature) to strengthen the film of the desired material, and the film containing the powder of inorganic material may be made mechanically weaker. In view of this, some examples are shown below.

FIG. 1 explains the aspect of the present invention by presenting an example of process, however, the present invention is not limited to this process alone.

It is also possible to repeat the same step several times to laminate films of different patterns and materials. Still more, it is also possible to form part of the pattern of the film containing powder of inorganic material by masking when forming the film of the desired material to dispose the film of desired material in part of the pattern. Besides, by laminating films of different materials on the pattern film containing powder of inorganic material, it is possible to form patterns of plural layers by a single mechanical removal step.

FIG. 2 is an explanatory drawing of a different patterning method of the film containing powder of inorganic material. FIG. 2 a), like FIG. 1 a), shows an aspect of forming the film 102 containing powder of inorganic material on the surface of a substrate 101. FIG. 2 b) denotes an appearance of printing a patterned film 201 on the film containing powder of inorganic material. This film 201 is a photoresist film which is dried after being printed and is greater in the mechanical strength than the film containing the powder of inorganic material. FIG. 2 c) shows the removal of the mechanically weak portion free from the photoresist on the film containing the powder of inorganic material by rubbing the surface of the sample thus prepared mechanically by using a brush 202. FIG. 2 d) represents the state of dissolving and removing the photoresist film by a solvent.

When a resin which readily thermally decomposes is used as the photoresist film or as an ink containing powder of inorganic material having such resin as the binder, by heating up to the decomposition temperature of the resin after printing, the photoresist film may be removed, or only the remains of the powder of inorganic material weak in the mechanical strength may be left over. At this time, it is preferable that the film containing the powder of inorganic material as the lower layer be weaker mechanically, too. This is because the powder of inorganic material is vitreous, and when it is melted and sintered by heating to be rigid, it may be stronger than the strength of the film of the desired material to be deposited next, so that mechanical removal is prohibited.

EXAMPLE 1

AQUADAG (trademark of NIHON ACHISON Co., Ltd.; a dispersant of graphite) was applied on a glass substrate by means of wire bar, and was dried, so that a film of about 1 $\mu$ in thickness containing powder of inorganic material was obtained. This film was scratched by using a pin of 100 $\mu$ in diameter. The edge of the drawn line was favorable, being not inferior to the pattern by photolithography. When the graphic film was scratched by a cutter knife, a line width of about 15 was realized. It was also possible to leave a graphite line of 15 $\mu$ in width.

On thus prepared sample, a tin oxide film of about 1000 A in thickness was formed on the entire surface by mist spray method. The heating temperature of the substrate was 570° C. After cooling, the sample surface was rubbed with a soft paper soaked with FOAMING (trademark of KAO Co., Ltd.; a kitchen detergent), and the tin oxide film was peeled off together with the graphite film, and the tin oxide film of the same pattern as drawn on the glass substrate was obtained.

EXAMPLE 2

Instead of the tin oxide used as the film of desired material in Example 1, a chrome film was disposed in a thickness of about 3000 A by sputtering deposition. This sample was heated to 450° C., cooled, and wiped with a wet gauze soaked in water, and the same pattern as drawn on the chrome film was left over.

After heating to 450° C., the graphite film was much lower in mechanical strength.

EXAMPLE 3

Instead of the film of desired material used in Example 1, an aluminum film was evaporated to obtain a sample. After letting stand for a week in air at room temperature, the sample surface was rubbed against with a soft paper coated with a paste of green ALUNDUM of abrasive grain size of #4000 and water. In consequence, an aluminum film in the same pattern as the drawn pattern was obtained. Right after deposition of aluminum, when the similar treatment was given, the aluminum corroded, and the pattern was deformed.

At the time of vapor deposition, by masking partly instead of treating the whole surface, it was also possible to form an aluminum deposition film in part of the drawn pattern.

EXAMPLE 4

Instead of the tin oxide used in Example 1, indium Instead oxide was formed by mist spray method. By treating otherwise similarly, a pattern of indium oxide film was formed.

EXAMPLE 5

A graphite film pattern was formed by photolithograph technology. This method is generally known as the method of forming the black matrix in the anode of the cathode ray tube of the television receiver. It is known as the lift-off method. In thus obtained sample, a tin oxide film was formed as a transparent conductive film by the mist spray method same as in Example 1, and the same treatment as in Example 1 was given. As a result, the tin oxide film was left over in the graphite-free portion.

After forming the tin oxide film, nickel was partly formed in a film thickness of about 5 $\mu$ by chemical plating. Then, heating to 450° C. for 1 hour and then cooling, the graphite film was brushed and removed, and a film pattern consisting of tin oxide and nickel layers was obtained.

EXAMPLE 6

A graphite film was formed on a glass substrate, and the resist ink of the following composition was coated in pattern by gravure printing to obtain a sample.

| | |
|---|---|
| Carbon powder MONARK 880 (CABOT Co., Ltd.) | 10 g |
| IBM 7 (acrylic resin prepared by Sekisui Plastics Co., Ltd.) | 30 g |
| n-Butyl carbitol acetate | 50 g |
| α-Terpineol | 15 g |

After drying, the surface was rubbed against with a wet paper soaked in #4000 green ALUNDUM. The portion of the printed resist ink was left over, while the other parts were rid of the graphite and the glass was exposed. Furthermore, the surface photoresist film was dissolved and removed by using toluene, and a tin oxide film was formed in about 3000 A by CVD. The substrate temperature at this time was about 300° C. This sample surface was polished with a soft paper soaked in JIFU (a detergent; trademark of Nihon Liver Co., Ltd.), and a tin oxide film in a desired pattern was obtained.

EXAMPLE 7

An ink composed of Graphite GP-60S (Hitachi Powder Metallurgy Co., Ltd.); 6 g, IBM 7 (acrylic resin prepared by Sekisui Plastics Co., Ltd.); 30 g, n-Butyl-carbitol acetate; 50 g, Linseed oil; 6 g was directly screen-printed on alumina. This sample was heated to 450° C. At this time, the resin component of the ink was burnt out, and only the mechanically weak pattern of graphite powder was left over, but this graphite was not easily peeled by impact unless directly touched. On its surface, an aluminum film was evaporated in a thickness of about 1000 A. This sample surface was wiped with a cloth soaked in water. As a result, an aluminum film pattern was obtained.

EXAMPLE 8

The ink in the same composition as in Example 7 was directly screen-printed on the glass in the segment type pattern for liquid crystal display. On its surface, a tin oxide film was formed in a thickness of about 1000 A by mist spray method, and it was polished with a piece of gauze containing water mixed with #4000 green ALUNDUM. As a result, a practical panel substrate for liquid crystal display was obtained.

EXAMPLE 9

An ink composed of powder of titanium dioxide; 10 g, IBM 7 (acrylic resin prepared by Sekisui Plastics Co., Ltd.); 15 g, n-Butyl carbitol acetate; 25 g was screen-printed on a glass. On its surface, tin oxide was formed in a thickness of about 1000 A by mist spray method. Afterwards, by brushing, the powder of titanium dioxide was removed, and a tin oxide film pattern was left over.

EXAMPLE 10

Using an ink composed of powder of alumina; 10 g, IBM 7 (acrylic resin prepared by Sekisui Plastics Co., Ltd.); 15 g, n-Butyl carbitol acetate; 25 g the same treatment as in Example 9 was effected, and similar results were obtained.

EXAMPLE 11

Using an ink composed of powder of zinc oxide; 10 g, IBM 7 (acrylic resin prepared by Sekisui Plastics Co., Ltd.); 15 g, n-Butyl carbitol acetate; 25 g the same treatment as in Example 9 was effected, and similar results were obtained.

EXAMPLE 12

Using an ink composed of powder of zirconium oxide; 10 g, IBM 7 (acrylic resin prepared by Sekisui Plastics Co., Ltd.); 15 g, n-Butyl carbitol acetate; 25 g the same treatment as in Example 8 was effected, and similar results were obtained.

EXAMPLE 13

Using an ink composed of powder of magnesium oxide; 10 g, IBM 7 (acrylic resin prepared by Sekisui Plastics Co., Ltd.); 15 g, n-Butyl carbitol acetate; 25 g the same treatment as in Example 9 was effected, and similar results were obtained.

What is claimed is:

1. A panel substrate fabricating method comprising:
   a step of forming a graphite film on a substrate,
   a step of mechanically removing a part of the graphite film to form a pattern of the graphite film,
   a step of forming a light-transparent conductive film on an entire surface of the substrate on which the pattern of the graphite film has been formed so that a part of the light-transparent conductive film is formed on the pattern of the graphite film, and
   a step of brushing the entire surface of the substrate with abrasive grains to remove the graphite film together with the part of the light-transparent conductive film formed thereon, thereby forming a light-transparent conductive film in a pattern.

2. The panel substrate fabricating method according to claim 1, wherein the light-transparent conductive film is formed by a mist spray method.

3. A pattern forming method comprising the steps of:
   printing a pattern of an ink comprising an inorganic powder and a resin binder on a substrate;
   burning out the resin binder by heating to form a pattern of the inorganic powder on the substrate;
   forming at least one layer of a film of a material on the substrate on which the pattern of the inorganic powder has been formed so that a part of the film of the material is formed on at least a part of the pattern of the inorganic powder; and
   mechanically removing the pattern of the inorganic powder together with the part of the film of the material formed thereon to form a pattern of the material.

4. A pattern forming method comprising the steps of:
   printing a pattern of an ink comprising an inorganic powder and a resin binder on a substrate;
   burning out the resin binder by heating to form a pattern of the inorganic powder on the substrate;
   forming a film of a material on the substrate on which the pattern of the inorganic powder is formed so that a part of the film of the material is formed on the entire surface of the pattern of the inorganic powder; and
   mechanically removing the pattern of the inorganic powder together with the part of the film of the material formed thereon to form a pattern of the material.

5. A pattern forming method comprising the steps of:
   forming a pattern of a first material comprising powder of graphite and a resin binder on a substrate;
   forming a film of a second material on the substrate on which said pattern has been formed so that a part of the film of the second material is formed on the entire surface of said pattern;
   burning out the resin binder by heating to make said pattern into a pattern of powder of graphite; and
   mechanically removing the pattern of the powder of graphite together with the part of the film of the second material formed thereon to form a pattern of the second material.

* * * * *